(12) United States Patent
Tsai et al.

(10) Patent No.: US 7,286,627 B2
(45) Date of Patent: Oct. 23, 2007

(54) SHIFT REGISTER CIRCUIT WITH HIGH STABILITY

(75) Inventors: Che-Fu Tsai, Chiayi County (TW); Wen-Chun Wang, Taichung (TW); Wen-Tui Liao, Taichung (TW)

(73) Assignee: Wintek Corporation, Taichung (TW)

( * ) Notice: Subject to any disclaimer, the term of this patent is extended or adjusted under 35 U.S.C. 154(b) by 173 days.

(21) Appl. No.: 11/186,858

(22) Filed: Jul. 22, 2005

(65) Prior Publication Data

US 2007/0019775 A1    Jan. 25, 2007

(51) Int. Cl.
*G11C 19/00*    (2006.01)
(52) U.S. Cl. .......................................... 377/64; 377/68
(58) Field of Classification Search ............ None
See application file for complete search history.

(56) References Cited

U.S. PATENT DOCUMENTS

| | | | |
|---|---|---|---|
| 5,222,082 A | | 6/1993 | Plus |
| 5,631,940 A | * | 5/1997 | Fujikura ............ 377/64 |
| 6,834,095 B2 | * | 12/2004 | Yu .................... 377/71 |
| 6,928,135 B2 | * | 8/2005 | Sasaki et al. ....... 377/64 |
| 7,027,550 B2 | * | 4/2006 | Lin ................... 377/64 |
| 2005/0220262 A1 | * | 10/2005 | Moon ................ 377/64 |

* cited by examiner

*Primary Examiner*—Tuan T Lam
(74) *Attorney, Agent, or Firm*—Birch, Stewart, Kolasch & Birch, LLP (57) ABSTRACT

A shift register circuit with high stability includes a plurality of stages, each including a supplementary unit for supplementing an output node with low voltage level. The present invention utilizes an output signal of the output node to feed back to a shift register circuit unit and act as a control signal. The control signal controls the shift register circuit unit, and further the output node of the shift register circuit unit is continuously supplemented with low voltage level. Thus, the shift register circuit of the present invention has the function of driving signal shift according to the necessity of active matrix liquid crystal panel. Furthermore, when an amorphous silicon thin film transistor is embodied in the shift register circuit, the present invention restrains the shift phenomena of the threshold voltage of the amorphous silicon thin film transistors and thereby increases the lifetime and stability of the shift register circuit.

3 Claims, 11 Drawing Sheets

SHIFT REGISTER CIRCUIT WITH HIGH STABILITY

FIELD OF THE INVENTION

The present invention relates to a shift register circuit with high stability, and more particularly to a shift register circuit formed by using the manufacturing process of an amorphous silicon thin film transistor (TFT) capable of increasing the stability and life time of the shift register circuit.

BACKGROUND OF THE INVENTION

The system on glass SOG technology can utilize the fabricating process of amorphous silicon a-Si or the fabricating process of the low temperature poly-silicon LTPS to integrate the system on glass substrate. The LTPS TFT has higher mobility, but the fabricating processes of the LTPS TFT are more complex than that of the a-Si TFT. On the contrary, the mobility of the a-Si TFT is worse than that of the LTPS TFT, but the fabricating processes of the a-Si TFT LCD is simpler and better development than that of the LTPS TFT LCD. Thus, the a-Si TFT has the advantage of low cost.

The a-Si TFT has the restriction of device, such as the threshold voltage Vth of the TFT device gradually increases when a-Si TFT's gate electrode is added bias stress. This is the important reason why the a-Si TFT is not integrated the system on glass (SOG) technology well. Thus, according to the a-Si TFT fabricating process integrated the system on glass (SOG) technology at present, the problem how to solve the unstable of threshold voltage Vth shifting is not easy to overcome.

Figure 1:
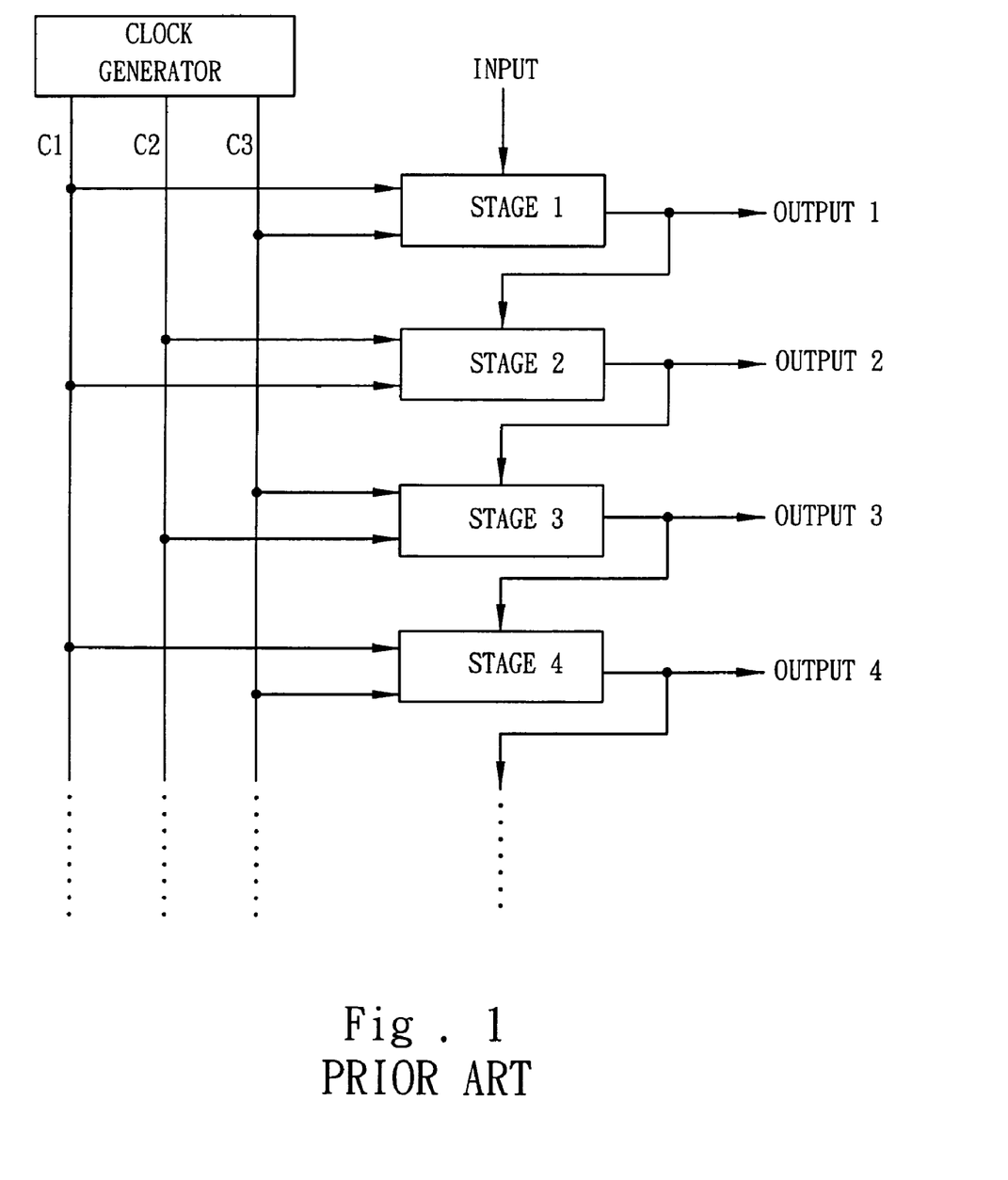
FIG. 1 is a schematic block diagram showing a structure of a shift register disclosed in U.S. Pat. No. 5,222,082.

U.S. Pat. No. 5,222,082, entitled "Shift Register Useful As A Select line Scanner For Liquid Crystal Display" issued on Jun. 22, 1993, discloses a block diagram of a shift register, shown in FIG. 1. The shift register includes a plurality of stages STAGE 1 to STAGE n. Each stage receives the output signal of previous stage in sequence and transmits an output signal OUTPUT 1 to OUTPUT n to the gate lines of the active matrix liquid crystal panel. In the beginning, an input signal INPUT is inputted to the stage 1, and the input signals of other stages are received from the output signal of the previous stage. A clock generator of the shift register circuit provides three clock signals C1, C2 and C3, which can control the odd stage and the even stage of the shift register by using two clock signals of them.

Figure 2:
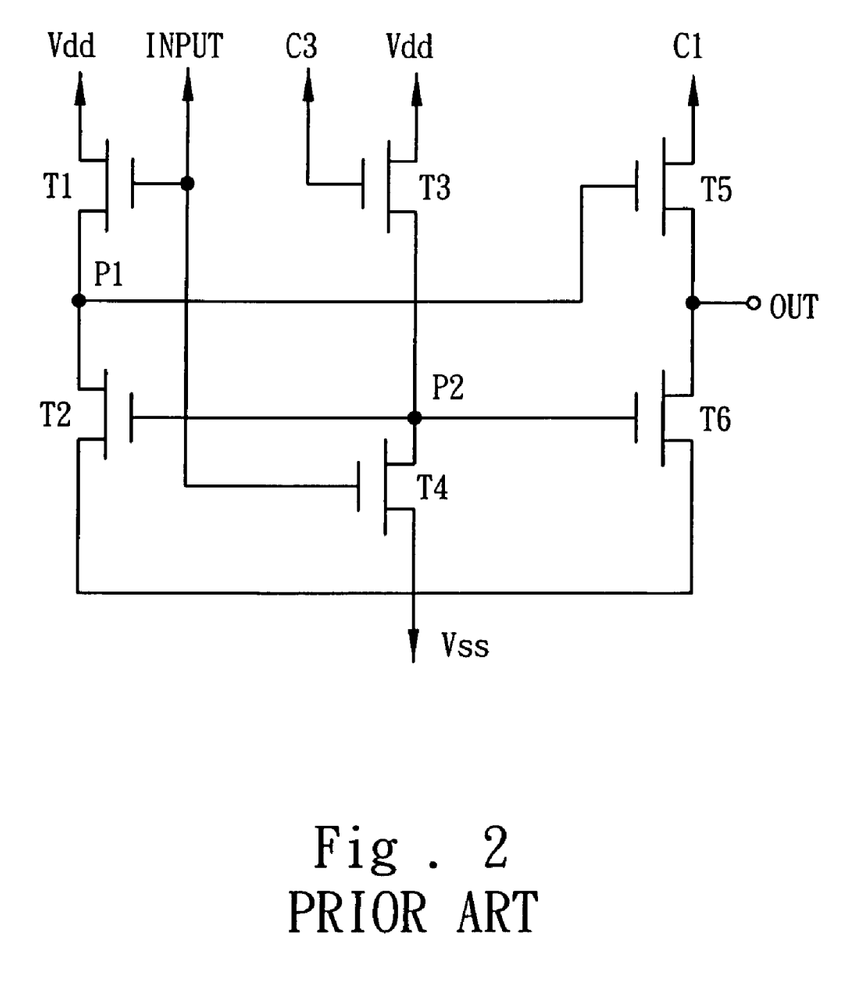
FIG. 2 is a schematic circuit diagram showing a stage of the shift register disclosed in U.S. Pat. No. 5,222,082.
Figure 3:
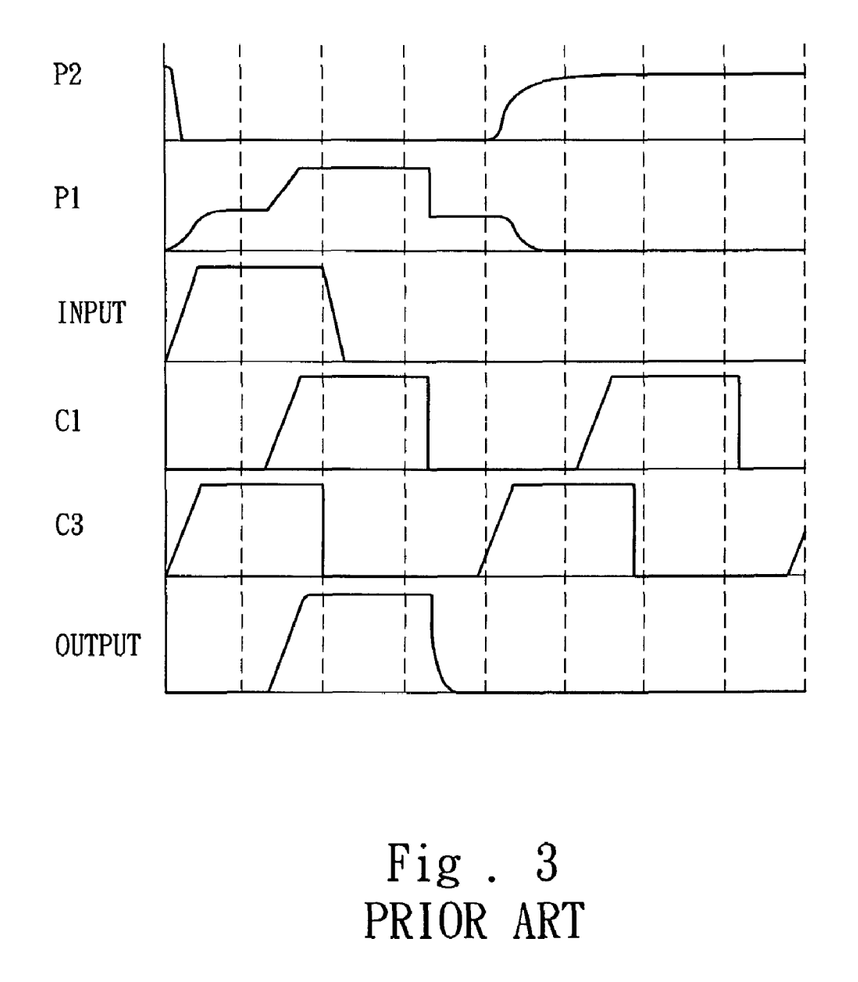
FIG. 3 shows the operational waveform of a stage of the shift register disclosed in U.S. Pat. No. 5,222,082.

The circuit of the stage 1 is constituted by six TFTs, shown in FIG. 2. Please refer to the time diagram of FIG. 3 simultaneously. The operation of shift register circuit above-mentioned patent is as follows:

When the input signal INPUT and the clock signal C1 are at high voltage level, the TFTs T3 and T4 respectively are turned on and simultaneously a node P2 is designed to be at low voltage level by adjusting the size of two TFTs T3 and T4. When the node P2 is at low voltage level, the TFTs T2 and T6 will be turned off. The TFT T1 is turned on, and thus the voltage level of the node P1 is Vdd minus $Vth_{T1}$ (Vdd−$Vth_{T1}$). The voltage level of the node P1 is still at high voltage level, and thus the TFT T5 will be turned on. Simultaneously, the output signal OUTPUT of an output terminal will be pulled to be at low voltage level by the low voltage level of the clock signal C1.

When the input signal INPUT is at low voltage level, the TFTs T1 and T4 will be turned off. Furthermore, the low voltage level of the clock signal C3 lets the TFT T3 turn off, whereby simultaneously the node P1 is at floating state. Simultaneously, the clock signal C1 is from low voltage level to high voltage level, and thus the node P1 is pulled to be at higher voltage level because of bootstrap effect, such that the high voltage level of the clock signal C1 can perfectly charge to the output terminal OUT. Simultaneously, the node P2 is at the floating state, and the voltage level thereof is decided to still be low voltage level by the previous state. When the input signal INPUT and the clock signals C1 and C3 are at low voltage level, the TFTs T3 and T4 will be turned off. Simultaneously the node P2 will be at the second floating state and still at low voltage level. At next time, if the clock signal C3 from low voltage level to high voltage level, the node P2 will be at high voltage level. Then, the node P2 will be the high voltage level in long time. The node P2 won't be the low voltage level until the input signal INPUT is from low voltage level to high voltage level. For above mentioned, the threshold voltage Vth of TFTs T2 and T6 seriously shifts by adding bias stress of TFT devices.

In conclusion, the disadvantage of U.S. Pat. No. 5,222,082 is that the node P2 of the circuit is at floating state at a short time during a frame time and thus the node P2 may be affected by the clock signals and other noise signals, such that the operation of the circuit is fault. In addition, the TFTs T2 and T6 are stressed by the DC voltage in a long time and thereby threshold voltage Vth of TFT devices seriously shifts. The operation of shift register circuit will fail because of threshold voltage shifting, so the life time reliability and of shift register circuit formed with a-Si TFT must be raised.

SUMMARY OF THE INVENTION

It is an object of the present invention to provide a shift register circuit. A supplementary unit for continuously supplying an output node with low voltage level can reduce the rise of threshold voltage of a-Si TFT continuously stressed, whereby the life time of the shift register circuit is increased.

It is another object of the present invention to utilize a supplement unit to design a shift register circuit, whose nodes are not at floating state anytime.

In order to achieve the foregoing objects, the present invention provides a shift register circuit with high stability. The shift register circuit includes a plurality of stages, and each of the stages receives the output signal of previous stage in sequence and transmitting an output signal to the gate lines of the active matrix liquid crystal panel. An input signal is inputted to an input terminal of the first stage, and the input signal of each of the other stages is from an output signal of the previous stage. Each of the stages includes a supplementary unit for supplying the output node with low voltage level. The present invention utilizes an output signal of the output node to feedback to a shift register circuit unit and act as a control signal. The control signal controls the shift register circuit unit, and further the output node of the shift register circuit unit is continuously supplied with low voltage level. Supplying low voltage level of a supplementary unit can avoid the output signal not affected by noise signals.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 4:
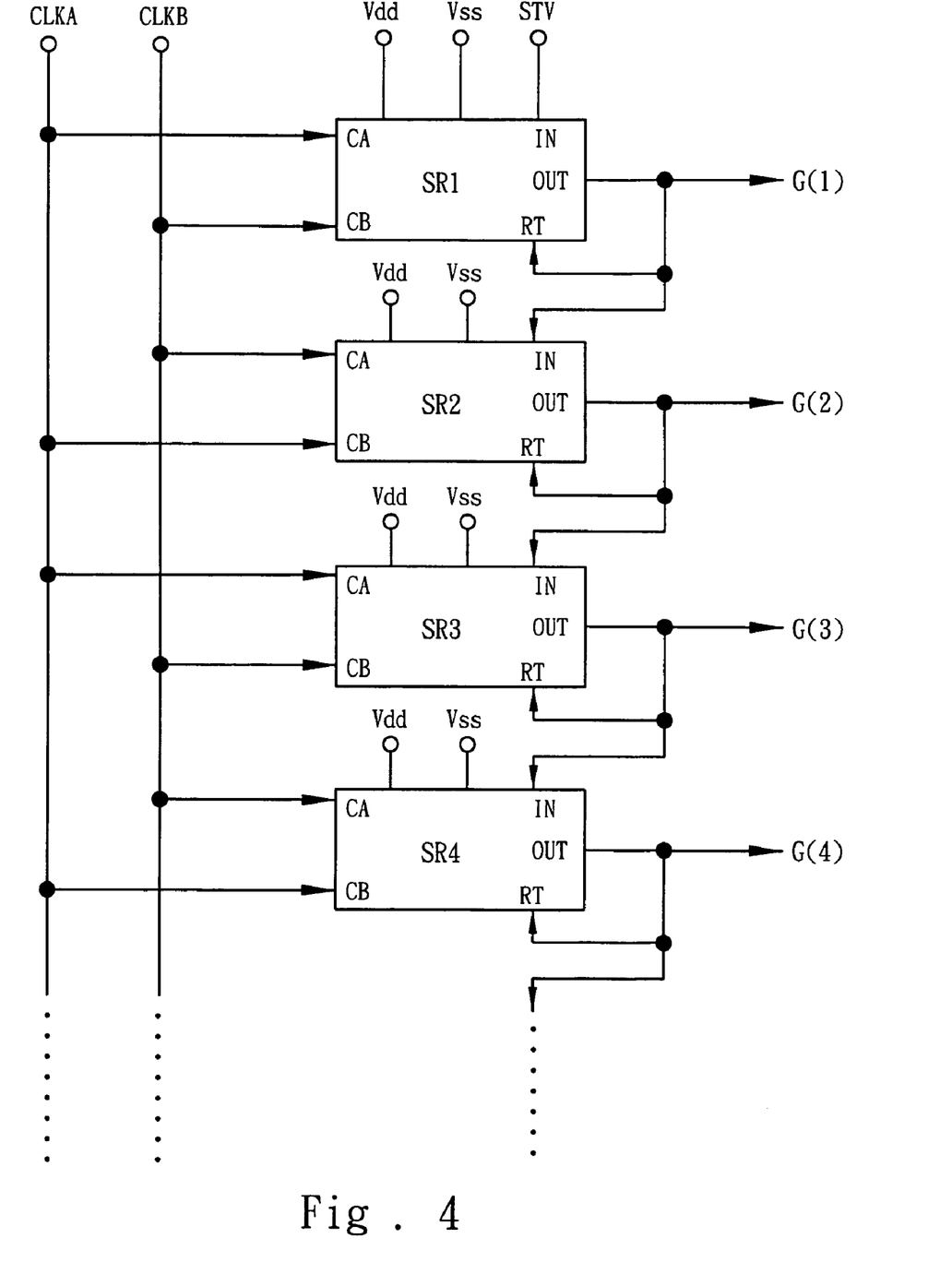
FIG. 4 is a schematic block diagram showing a structure of a shift register circuit of the present invention.
Figure 5:
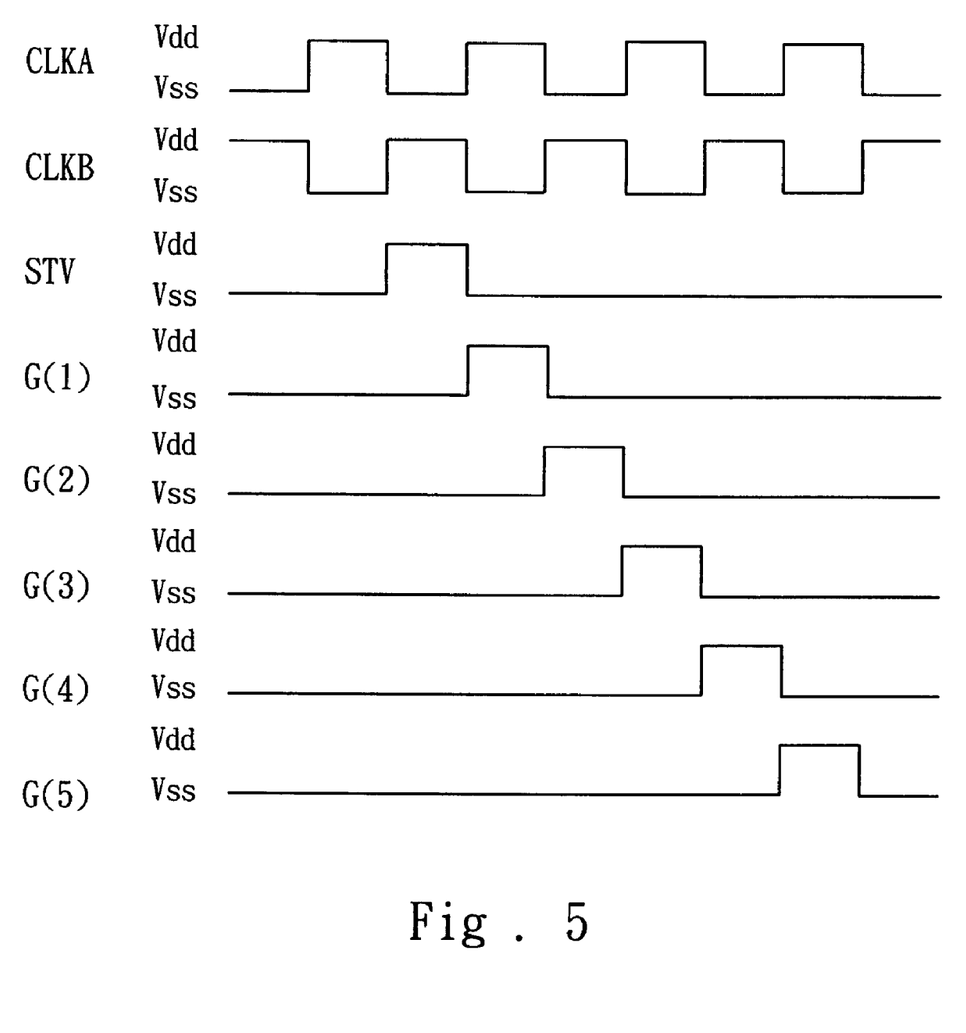
FIG. 5 shows the relationship between the waveform and time of the input signals and the output signals of the present invention.

Referring to FIG. 4, it shows a schematic block diagram of shift register circuit structure at the present invention. The present invention provides a shift register circuit with high stability, which includes a plurality of stages, e.g. SR1~SR4, shown in FIG. 1. Each stage receives the output signal of previous stage in sequence and transmits an output signal e.g. G1~G4 to the gate lines of the active matrix liquid crystal panel, shown in FIG. 4. An input signal STV is inputted to an input terminal IN of the first stage SR1, and the input terminals IN of the other stages SR2~SR4 receive the input signal from previous stage output signal. The circuit of each stage has a supply voltage Vdd with high voltage level, a supply voltage Vss with low voltage level, and clock signals CLKA, CLKB, wherein the clock signals are in an inverse condition, and become the input signals of a first clock terminal CA and a second clock terminal CB of shift register circuit respectively, wherein the first clock terminal CA of odd stage of the shift register circuit receives the clock signal CLKA, the second clock terminal CB receives the clock signal CLKB, the first clock terminal CA of even stage receives the clock signal CLKB, and the second clock terminal CB receives the clock signal CLKA. Referring to FIG. 5, it shows the relationship of time diagram with input signals CLKA, CLKB and STV and the output signals G1~G5.

Figure 6:
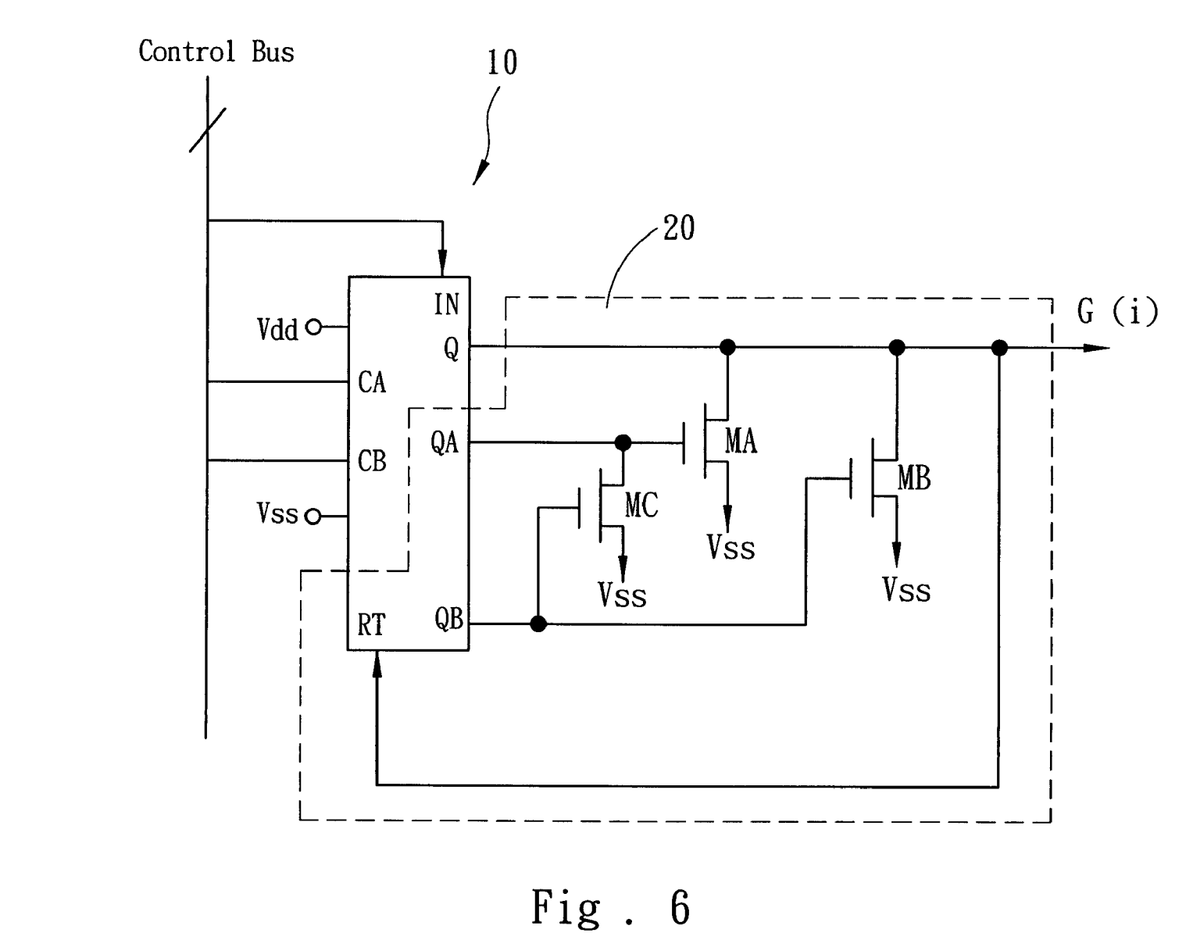
FIG. 6 shows the operational waveform of each stage of the shift register circuit of the present invention.

Referring to FIG. 6, each stage of the present invention includes a shift register circuit unit 10. A supplementary unit 20 is added for electrically connecting to an output node Q of the shift register circuit unit 10. The present invention utilizes the output signal of the output node Q to feedback to a node belonged to the shift register circuit unit 10 by itself, whereby the node acts as a control node RT. The control signal of the control node RT controls the shift register circuit unit 10, and further the output node Q of the shift register circuit unit 10 is continuously supplied with low voltage level. Supplying low voltage level of a supplementary unit can avoid the output signal not affected by noise signals.

The supplementary unit 20 includes a first supplementary TFT MA with a gate electrode electrically connected to a first derivative node QA of the shift register circuit unit 10, a drain electrode electrically connected to the output node Q, and a source electrode electrically connected to the supply voltage Vss with low voltage level; a second supplementary TFT MB with a gate electrode, a drain electrode and a source electrode, wherein the gate electrode electrically connected to a second derivative node QB of the shift register circuit unit 10, the signal of the second derivative node QB is the same as that of the second clock terminal CB, the drain electrode is electrically connected to the output node Q, and a source electrode is electrically connected to the supply voltage Vss with low voltage level; and a third supplementary TFT MC with a gate electrode electrically connected to the second derivative node QB of the shift register circuit unit 10, a drain electrode electrically connected to the first derivative node QA, and a source electrode electrically connected to the supply voltage Vss with low voltage level.

The first derivative node QA controls the first supplementary TFT MA, and the second derivative node QB controls the second supplementary TFT MB and the third supplementary TFT MC, whereby the output node Q is continuously supplemented with low voltage level. The first supplementary TFT MA and the second supplementary TFT MB are stressed during a half of duty cycle only. Thus, threshold voltage shifting of a-Si TFT device will be reduced, and further the lifetime of the shift register circuit is increased.

In order to show the operation of the shift register circuit unit 10 and the supplementary unit 20 in detail, the following embodiments describe the shift register circuit in detail. The first embodiment: please refer to FIG. 7, it shows a schematic of shift register circuit diagram in single stage; and refer to FIG. 8, it is the operational of time diagram waveforms in correlative nodes.

Figure 7:
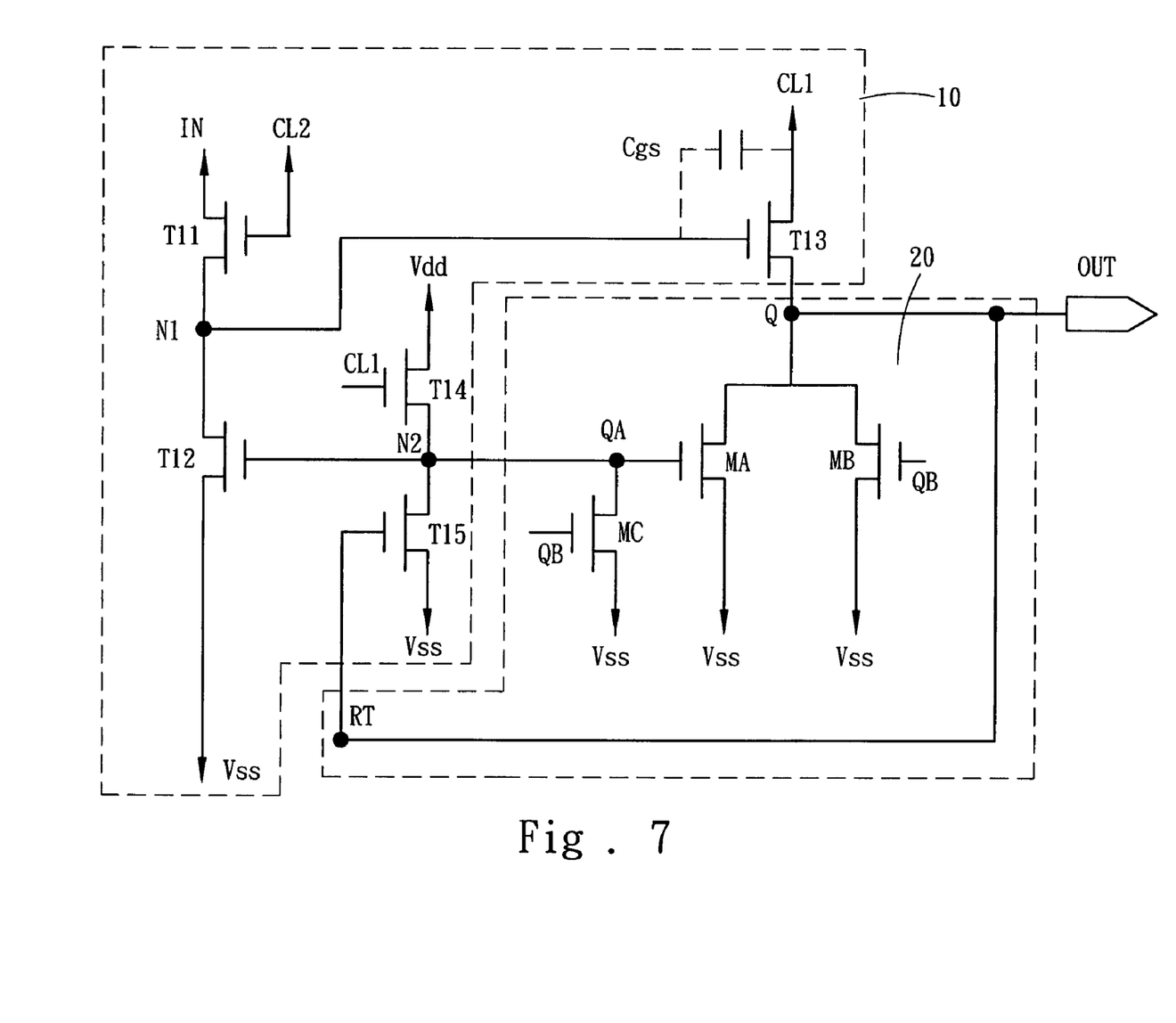
FIG. 7 is a schematic circuit diagram showing a circuit of single stage in the first embodiment of the present invention.

The shift register circuit unit 10 includes a first TFT T11 with a gate electrode electrically connected to a second clock signal CL2, i.e. the signal received from the second clock terminal CB, and a drain electrode electrically connected to a signal of the input terminal IN; a second TFT T12 with a drain electrode and a source electrode, wherein the drain electrode of the second TFT T12 and the source electrode of the first TFT T11 are electrically connected to a first node N1, and the source electrode of the second TFT T12 is electrically connected to the supply voltage Vss with low voltage level; a third TFT T13 with a drain electrode electrically connected to a first clock signal CL1, i.e. the signal received from the first clock terminal CA, the gate electrode electrically connected to a first node N1, and a source electrode is the output node, i.e. an output terminal OUT; and a fourth TFT T14 with a gate electrode electrically connected to a first clock signal CL1, and a drain electrode electrically connected to a supply voltage Vdd with high voltage level; a fifth TFT T15 with a gate electrode, a source electrode and a drain electrode, wherein the fifth TFT's T15 gate electrode is the control node RT, the output signal of the output node Q feedbacks to the control node RT of the shift register circuit unit 10 itself, the fifth TFT's T15 source electrode is electrically connected to the supply voltage Vss with low voltage level, and the fifth TFT's T15 drain electrode and the fourth TFT's T14 source electrode are electrically connected to a second node N2, such that the fifth TFT T15 and the fourth TFT T14 form an inverter, and the second TFT's T12 gate electrode is electrically connected to a second node N2.

The second node N2 is also the first derivative node QA of the supplementary unit 20, and the feature of the first embodiment utilizes the output signal of the output node Q to feedback to a node belonged to the shift register circuit unit 10 itself, thereby controlling the inverter, i.e. the fourth TFT T14 and the fifth TFT T15. Thus, the inverter is controlled by the output signal and first clock signal CL1 of the present stage, whereby the supplementary unit 20 is controlled; the output node Q (output terminal) is continuously supplemented with low voltage level. So the output terminal Q will not be affected by noise signals.

Figure 8:
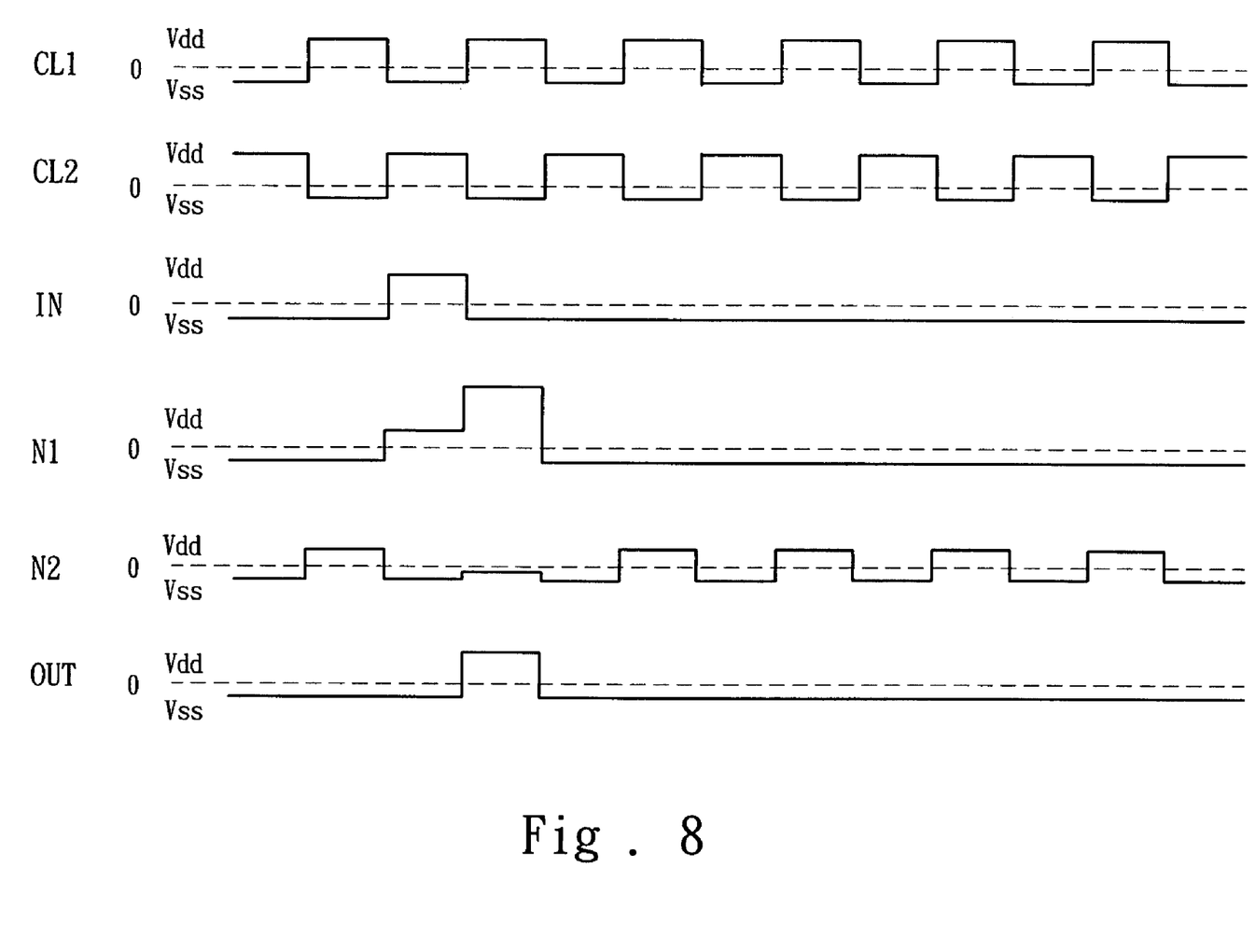
FIG. 8 shows the operational waveforms of the correlative nodes in the first embodiment of the present invention.

The operational principle of the circuit of the present embodiment is described as follows:

1. When the pulse of input terminal IN and the clock signal CL2 are at the same trigger phase, the voltage level of input terminal IN is at high voltage level Vdd, the voltage level of second clock signal CL2 is also at high voltage level Vdd, the voltage level of first clock signal CL1 is at low voltage level Vss, the voltage level of first node N1 is charged to be Vdd minus $Vth_{T11}$ (Vdd−$Vth_{T11}$), and the output voltage level of the output terminal OUT is at low voltage level Vss. The reasons are as follows:

a. the first TFT T11 is turned on, because the second clock signal CL2 is at high voltage level Vdd;

b. the second TFT T12 is turned off, because the second note N2 is at low voltage level Vss;

c. the third TFT T13 is turned on, because the voltage of the first note N1 is Vdd minus Vth1 (Vdd−Vth1);

d. the fourth TFT T14 is turned off, because the first clock signal CL1 is at low voltage level Vss;

e. the fifth TFT T15 is turned off, because the signal of the output terminal OUT is at low voltage level Vss;

f. the first supplementary TFT MA is turned off, because the second note N2 is at low voltage level Vss;

g. the second supplementary TFT MB is turned on, because the second clock signal CL2 is at high voltage level Vdd;

h. the third supplementary TFT MC is turned on, because the second clock signal CL2 is at high voltage level Vdd;

i. the voltage of the first node N1 is charged to be Vdd minus $Vth_{T11}$ (Vdd−$Vth_{T11}$), because the first TFT T11 is turned on so as to pull up the voltage of the first node N1 to be Vdd minus $Vth_{T11}$ (Vdd−$Vth_{T11}$);

j. the second node N2 is discharged to be low voltage level Vss, because the third supplementary TFT MC is turned on so as to pull down the second node N2 to be discharged to low voltage level Vss; and k. the output terminal OUT is to be at low voltage level Vss, because the third TFT T13 and the second supplementary TFT MB are turned on so as to pull down the output terminal OUT to be at low voltage level Vss.

2. When the signal of the input terminal IN is at low voltage level Vss, the second clock signal CL2 is also at low voltage level Vss, the first clock signal CL1 is at high voltage level Vdd, and the voltage of the first node N1 is increased from Vdd−$Vth_{T11}$ to Vdd−$Vth_{T11}$+ΔVp because of the bootstrap effect [wherein ΔVp=$C_{gs}$(Vdd−Vss)/($C_{gs}$+$C_{N1}$), and $C_{N1}$ is the parasitic capacitance of the first node N1], and the output terminal OUT is charged from low voltage level Vss to high voltage level Vdd. The reasons are as follows:

a. the first TFT T11 is turned off, because the second clock signal CL2 is at low voltage level Vss;

b. the second TFT T12 is turned off, because the second note N2 is at low voltage level Vss;

c. the third TFT T13 is turned on, because the voltage of the first note N1 is Vdd−$Vth_{T11}$+ΔVp;

d. the fourth TFT T14 is turned on, because the first clock signal CL1 is at high voltage level Vdd;

e. the fifth TFT T15 is turned on, because the signal of the output terminal OUT is at high voltage level Vdd;

f. the first supplementary TFT MA is turned off, because the second note N2 is at low voltage level Vss;

g. the second supplementary TFT MB is turned off, because the second clock signal CL2 is at low voltage level Vss;

h. the third supplementary TFT MC is turned off, because the second clock signal CL2 is at low voltage level Vss;

i. the voltage of the first node N1 is Vdd−$Vth_{T11}$+ΔVp, because the first and second TFTs T11, T12 are turned off, the first node N1 is at a floating state, and the voltage of the first node N1 is increased from Vdd−$Vth_{T11}$ to Vdd−$Vth_{T11}$+ΔVp because the bootstrap effect is caused by the first clock signal CL1 being from low voltage level Vss to high voltage level Vdd;

j. the second node N2 is at low voltage level being higher than Vss, because the size W/L of the fifth TFT T15 is larger than that of the fourth TFT T14, e.g. the ratio of the size of the fifth TFT T15 to that of the fourth TFT T14 is 10:1 for example, whereby the second node N2 is still kept to be at the state of low voltage level near the supply voltage of low voltage level Vss, even if the fourth and fifth TFTs T14 and T15 are turned on simultaneously; and k. the output terminal OUT is at high voltage level Vdd, because the third TFT T13 is turned on, and the voltage of the first node N1 is increased from Vdd−$Vth_{T11}$ to Vdd−$Vth_{T11}$+ΔVp because of the bootstrap effect [wherein ΔVp=$C_{gs}$(Vdd−Vss)/($C_{gs}$+$C_{N1}$), and $C_{N1}$ is the parasitic capacitance of the first node N1], whereby the voltage of the output terminal OUT is perfectly charged from low voltage level Vss to high voltage level Vdd because the voltage of the first node N1 is much larger than the high voltage level Vdd.

3. When the first clock signal CL1 is at low voltage level Vss and the second clock signal CL2 is at high voltage level Vdd, the signal of the input terminal IN is continuously kept to be at low voltage level Vss, the voltage of the first node N1 is changed from Vdd−$Vth_{T11}$+ΔVp to low voltage level Vss, and the voltage of the output terminal OUT is discharged from high voltage level Vdd to low voltage level Vss. The reasons are as follows:

a. the first TFT T11 is turned on, because the second clock signal CL2 is at high voltage level Vdd;

b. the second TFT T12 is turned off, because the second note N2 is at low voltage level Vss;

c. the third TFT T13 is turned off, because the first note N1 is at low voltage level Vss;

d. the fourth TFT T14 is turned off, because the first clock signal CL1 is at low voltage level Vss;

e. the fifth TFT T15 is turned off, because the signal of the output terminal OUT is at low voltage level Vss;

f. the first supplementary TFT MA is turned off, because the second note N2 is at low voltage level Vss;

g. the second supplementary TFT MB is turned on, because the second clock signal CL2 is at high voltage level Vdd;

h. the third supplementary TFT MC is turned on, because the second clock signal CL2 is at high voltage level Vdd;

i. the voltage of the first node N1 is at low voltage level Vss, because the first TFT T11 is turned on, whereby the voltage of the first node N1 is changed from Vdd−$Vth_{T11}$+ΔVp to low voltage level Vss;

j. the second node N2 is at low voltage level Vss, because the third supplementary TFT MC is turned on, whereby the voltage of the second node N2 is pulled to be at low voltage level Vss; and k. the output terminal OUT is at low voltage level Vss, because the second supplementary TFT MB is turned on, whereby the output terminal OUT is pulled to be at low voltage level Vss.

4. When the second clock signal CL2 is at low voltage level Vss and the first clock signal CL1 is at high voltage level Vdd, the signal of the input terminal IN is continuously kept to be at low voltage level Vss, the voltage of the first node N1 is kept to be at low voltage level Vss, and the voltage of the output terminal OUT is kept to be at low voltage level Vss. The reasons are as follows:

a. the first TFT T11 is turned off, because the second clock signal CL2 is at low voltage level Vss;

b. the second TFT T12 is turned on, because the voltage of the second note N2 is Vdd−Vth4;

c. the third TFT T13 is turned off, because the first note N1 is at low voltage level Vss;

d. the fourth TFT T14 is turned on, because the first clock signal CL1 is at high voltage level Vdd;

e. the fifth TFT T15 is turned off, because the signal of the output terminal OUT is at low voltage level Vss;

f. the first supplementary TFT MA is turned on, because the second note N2 is Vdd−Vth4;

g. the second supplementary TFT MB is turned off, because the second clock signal CL2 is at low voltage level Vss;

h. the third supplementary TFT MC is turned off, because the second clock signal CL2 is at low voltage level Vss;

i. the voltage of the first node N1 is at low voltage level Vss, because the second TFT T12 is turned on, and then the voltage of the first node N1 is pulled to be at low voltage level Vss;

j. the second node N2 is Vdd−Vth4, because the fourth TFT T14 is turned on, whereby the voltage of the second node N2 is pulled to be Vdd−Vth4; and k. the output terminal OUT is at low voltage level Vss, because the first supplementary TFT MA is turned on and then the output terminal OUT is pulled down to be at low voltage level Vss.

5. When the first clock signal CL1 is at low voltage level Vss and the second clock signal CL2 is at high voltage level Vdd, the signal of the input terminal IN is continuously kept to be at low voltage level Vss and then the voltage of the output terminal OUT is kept to be at low voltage level Vss. The reasons are as follows:

a. the first TFT T11 is turned on, because the second clock signal CL2 is at high voltage level Vdd;

b. the second TFT T12 is turned off, because the second note N2 is at low voltage level Vss;

c. the third TFT T13 is turned off, because the first note N1 is at low voltage level Vss;

d. the fourth TFT T14 is turned off, because the first clock signal CL1 is at low voltage level Vss;

e. the fifth TFT T15 is turned off, because the signal of the output terminal OUT is at low voltage level Vss;

f. the first supplementary TFT MA is turned off, because the second note N2 is at low voltage level Vss;

g. the second supplementary TFT MB is turned on, because the second clock signal CL2 is at high voltage level Vdd;

h. the third supplementary TFT MC is turned on, because the second clock signal CL2 is at high voltage level Vdd;

i. the voltage of the first node N1 is at low voltage level Vss, because the first TFT T11 is turned on, and then the voltage of the first node N1 is continuously pulled down to be at low voltage level Vss;

j. the second node N2 is at low voltage level Vss, because the third supplementary TFT MC is turned on and then the voltage of provides the second note N2 with voltage level pulled down to be at low voltage level Vss; and k. the output terminal OUT is at low voltage level Vss, because the second supplementary TFT MB is turned on and then the output terminal OUT is continuously pulled to be at low voltage level Vss.

As described in the above-mentioned operational principle, the present invention utilizes the output terminal OUT to feedback to the shift register circuit unit 10 to control the fifth TFT T15 and associates the inverter formed by the first clock signal CL1 connected to the fourth TFT T14 during the time of the first clock signal CL1. The output signal of the inverter turns on the second TFT T12 and supplements the first note N1 with the voltage of low voltage level, and the second clock signal CL2 controls the first TFT T11 and supplements the first note N1 with the voltage of low voltage level during the time of the second clock signal CL2. Thus, according to the present invention, there is only a half of duty cycle in the second TFT T12 of the shift register circuit unit 10, and first note N1 is not at the floating state when the second TFT T12 is stressed.

The present invention utilizes the output terminal OUT to control the fifth TFT T15 and associates the inverter formed by the fourth TFT T14 controlled by the first clock signal CL1 during the time of the first clock signal CL1. The output signal of the inverter provides the first note N1 with voltage level, and the second clock signal CL2 controls the third supplementary TFT MC to provide another voltage level during the time of the second clock signal CL2, whereby the second note N2 is not at the floating state.

The present invention utilizes the output terminal OUT to control the fifth TFT T15 and associates the inverter formed by the fourth TFT T14 controlled by the first clock signal CL1 during the time of the first clock signal CL1. The output signal of the inverter turns on the first supplementary TFT MA and supplements with the voltage of low voltage level, and the second clock signal CL2 controls the second supplementary TFT MB and supplements with the voltage of low voltage level during the time of the second clock signal CL2, whereby the output terminal OUT can be supplemented with low voltage level anytime.

In other words, when the shift register circuit in the present embodiment is operated, the second TFT T12, the first supplementary TFT MA and the second supplementary TFT MB are alternately driven in a half of duty cycle, and those are different from the TFTs T2 and T6 of U.S. Pat. No. 5,222,082, which is continuously stressed in the direct current condition. The design manner of the present invention can improve the shift phenomena of the threshold voltages of the second TFT T12, the first supplementary TFT MA and the second supplementary TFT MB and decrease the increasing degree of the threshold voltages of the second TFT T12, the first supplementary TFT MA and the second supplementary TFT MB because the life time is extended, thereby increasing the stability of the shift register circuit and the normal life time of the shift register circuit. Furthermore, according to the shift register circuit in the first embodiment, every node is not at the floating state and thereby can avoid the normal operation of circuit not affected by noise signals.

Figure 9:
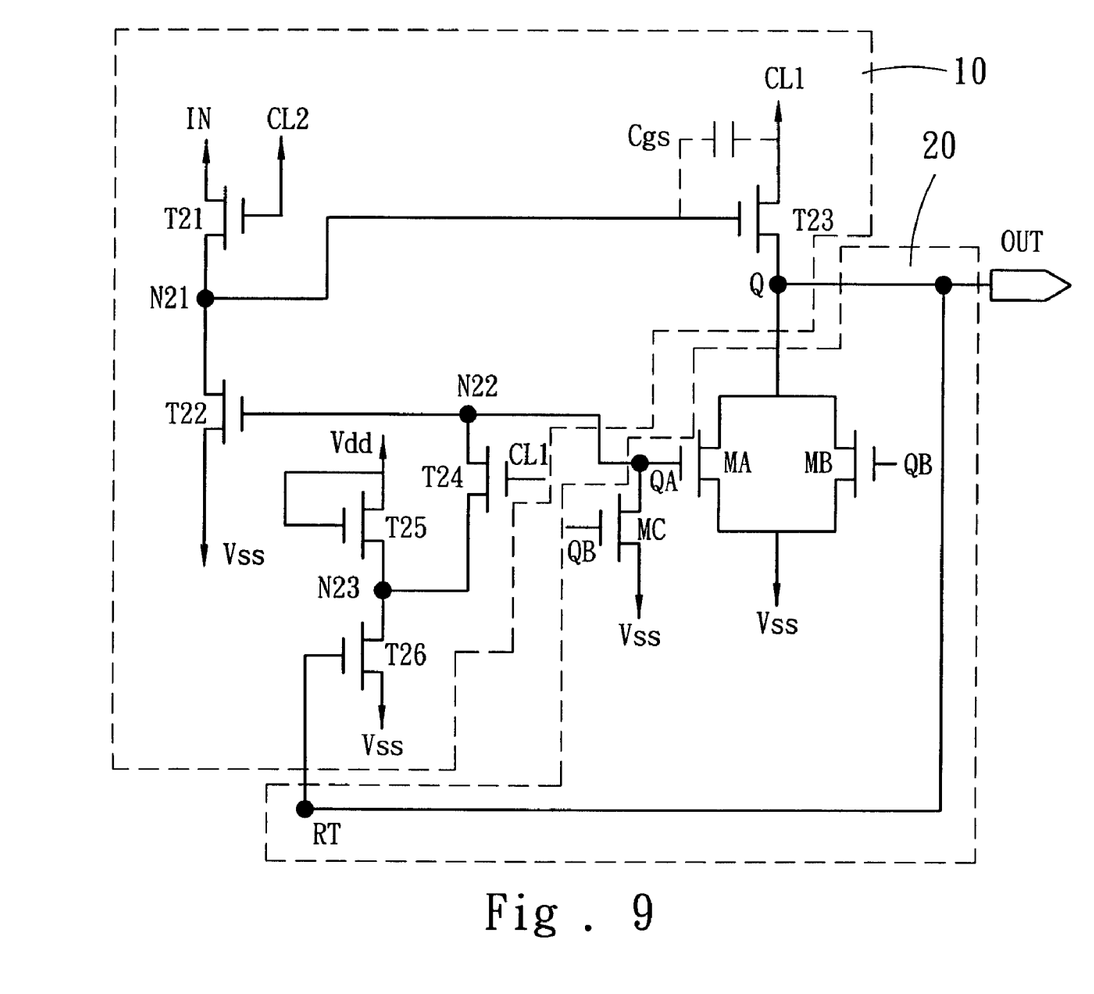
FIG. 9 is a schematic circuit diagram showing a circuit of single stage in the second embodiment of the present invention.
Figure 10:
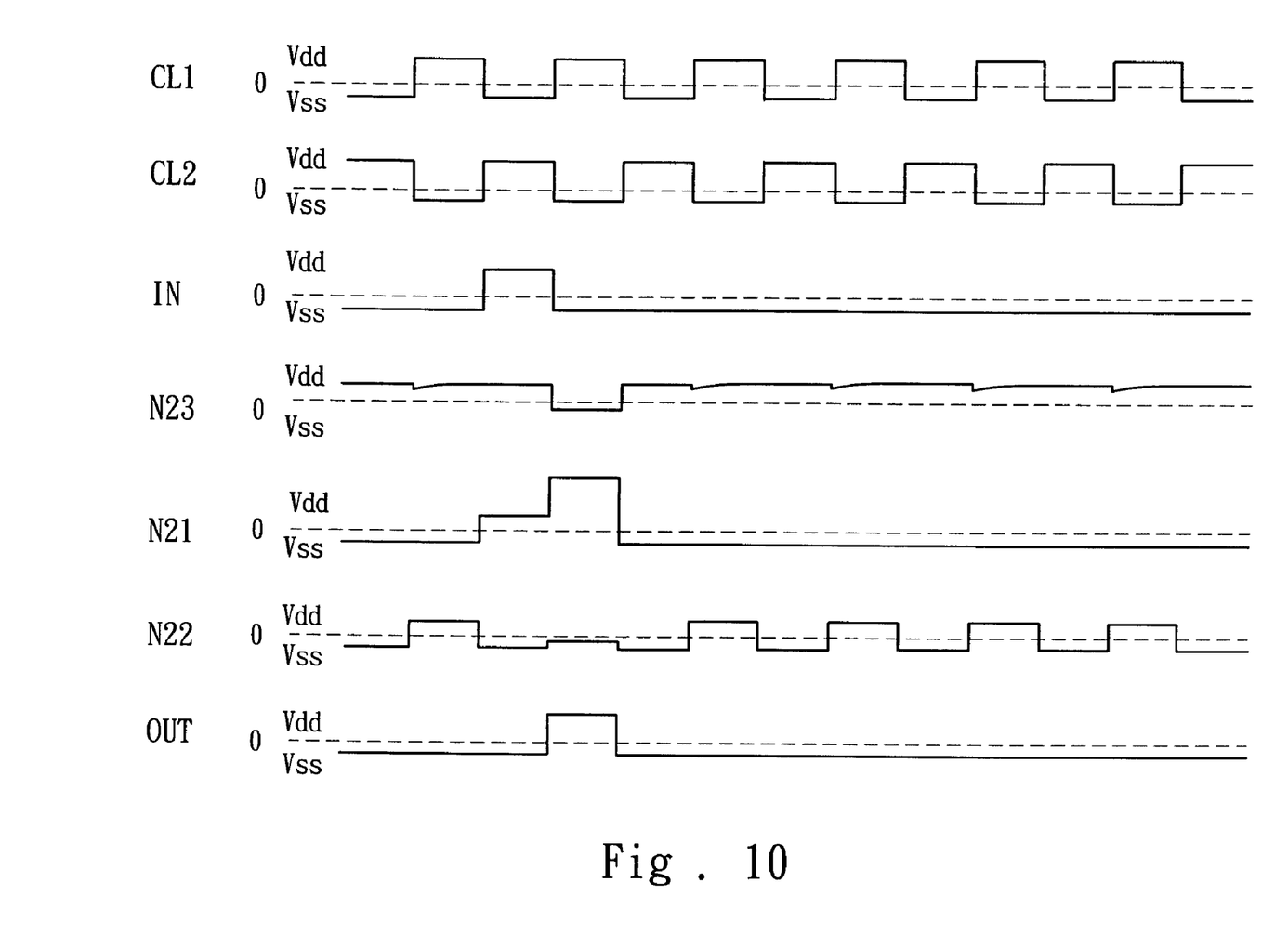
FIG. 10 shows the operational waveforms of the correlative nodes in the second embodiment of the present invention.

The second embodiment: please refer to FIG. 9, it shows a schematic view of the circuit of single stage; and refer to FIG. 10, it shows a schematic view of the operational waveform of the correlative nodes.

The shift register circuit unit 10 includes a first TFT T21 having a gate electrode electrically connected to a second clock signal CL2, i.e. the signal received from the second clock terminal CB, and a drain electrode electrically connected to a signal of the input terminal IN; a second TFT T22 having a drain electrode and a source electrode, wherein the second TFT's T22 drain electrode and the first TFT's T21 source electrode are electrically connected to a first note N21, and the second TFT's T22 source electrode is electrically connected to the supply voltage Vss with low voltage level; a third TFT T23 having a gate electrode electrically connected to the first note N21, a drain electrode electrically connected to a first clock signal CL1, i.e. the signal received from the first clock terminal CA, and a source electrode being an output node, i.e. an output terminal OUT; a fifth TFT T25 having a gate electrode and a source electrode are electrically connected to the supply voltage Vdd with high voltage level; a sixth TFT T26 having a gate electrode, a source electrode and a drain electrode, wherein the sixth TFT's T26 gate electrode is the control node RT, the output signal of the output node Q feedbacks to the control node RT of the shift register circuit unit 10 itself, the sixth TFT's T26 source electrode is electrically connected to the supply voltage Vss with low voltage level, and the sixth TFT's T26 drain electrode and the fifth TFT's T25 source electrode are electrically connected to a third node N23, such that the fifth TFT T25 and the sixth TFT T26 form an inverter; a fourth TFT T24 having a gate electrode, a drain electrode and a source electrode, wherein the fourth TFT's T24 gate electrode electrically connected to a first clock signal CL1, the fourth TFT's T24 drain electrode and the second TFT's T22 gate electrode are electrically connected to the second node N22, and the fourth TFT's T24 source electrode is electrically connected to the third node N23.

The second node N22 is also the derivative node QA of the supplementary unit 20, and the feature of the second embodiment utilizes the output signal of the output node Q to feedback to a node belonged to the shift register circuit unit 10 itself, thereby controlling the inverter, i.e. the sixth TFT T26 and the fifth TFT T25. Thus, the inverter is controlled by the output signal of the present stage, whereby the supplementary unit 20 is controlled to continuously supplement the output terminal OUT with low voltage level.

The operational principle of the circuit of the present embodiment is described as follows:

1. The initial pulse of the signal of the input terminal IN and the clock signal CL2 are at high voltage level Vdd, and the first clock signal CL1 is at low voltage level Vss, the voltage level of the first node N21 is charged from low voltage level Vss to Vdd minus Vth1 (Vdd−Vth1), and the output voltage of the output terminal OUT is kept to be at low voltage level Vss. The reasons are as follows:

a. the first TFT T21 is turned on, because the second clock signal CL2 is at high voltage level Vdd;

b. the second TFT T22 is turned off, because the second clock signal CL2 is at high voltage level Vdd and the third supplementary TFT MC is turned on, whereby the second note N22 is at low voltage level Vss;

c. the third TFT T23 is turned on, because the voltage of the first note N21 is Vdd minus Vth$_{T21}$ (Vdd−Vth$_{T21}$);

d. the fourth TFT T24 is turned off, because the first clock signal CL1 is at low voltage level Vss;

e. the third supplementary TFT MC is turned on, because the second clock signal CL2 is at high voltage level Vdd;

f. the fifth TFT T25 is turned on, wherein the fifth TFT T25 is kept to turn on;

g. the sixth TFT T26 is turned off, because the output terminal OUT is at low voltage level Vss;

h. the first supplementary TFT MA is turned off, because the second note N22 is at low voltage level Vss;

i. the second supplementary TFT MB is turned on, because the second clock signal CL2 is at high voltage level Vdd;

j. the voltage of the first node N21 is increased to be Vdd minus Vth1 (Vdd−Vth1), because the first TFT T21 is turned on and the signal of the input terminal IN is at high voltage level Vdd;

k. the second node N22 is at low voltage level Vss, because the second clock signal CL2 is at high voltage level Vdd and the third supplementary TFT MC is turned on, whereby the second note N22 is pulled to be at low voltage level Vss and the fourth TFT T24 is turned off; and l. the voltage of the third node N23 is Vdd−Vth$_{T25}$, because the fourth and sixth TFTs T24 and T26 are turned off.

2. When the signal of the input terminal IN is at low voltage level Vss, the second clock signal CL2 is at low voltage level Vss, the first clock signal CL1 is at high voltage level Vdd, and the voltage of the first node N21 is increased from Vdd−Vth$_{T21}$ to Vdd−Vth$_{T21}$+ΔVp because of the bootstrap effect [wherein ΔVp=C$_{gs}$ (Vdd−Vss)/(C$_{gs}$+C$_{N2}$), and C$_{N2}$ is the parasitic capacitance of the first node N21], and the output terminal OUT is charged from low voltage level Vss to high voltage level Vdd. The reasons are as follows:

a. the first TFT T21 is turned off, because the second clock signal CL2 is at low voltage level Vss;

b. the second TFT T22 is turned off, because the second note N22 is at low voltage level Vss;

c. the third TFT T23 is turned on, because the voltage of the first note N21 is Vdd−Vth$_{T21}$+ΔVp;

d. the fourth TFT T24 is turned on, because the first clock signal CL1 is at high voltage level Vdd;

e. the third supplementary TFT MC is turned off, because the second clock signal CL2 is at low voltage level Vss;

f. the fifth TFT T25 is turned on;

g. the sixth TFT T26 is turned on, because the output terminal OUT is at high voltage level Vdd;

h. the first supplementary TFT MA is turned off, because the second note N22 is at low voltage level Vss;

i. the second supplementary TFT MB is turned off, because the second clock signal CL2 is at low voltage level Vss;

j. the voltage of the first node N21 is from Vdd−Vth$_{T21}$ to Vdd−Vth$_{T21}$+ΔVP, because the bootstrap effect is cause by the first clock signal CL1 being from low voltage level Vss to high voltage level Vdd;

k. the voltage of the third node N23 depends on the size of the fifth and sixth TFTs T25, T26, and the voltage of the third node N23 in the present embodiment must be designed to be at low voltage level in time so as to turn off the second TFT T22; and l. the second node N22 is at low voltage level, simultaneously the voltage of the third node N23 is at low voltage level, and simultaneously the first clock signal CL1 is at high voltage level Vdd, whereby the second node N22 is pulled to be at low voltage level so as to turn off the second TFT T22.

3. When the first clock signal CL1 is at low voltage level Vss and the second clock signal CL2 is at high voltage level Vdd, the signal of the input terminal IN is continuously kept to be at low voltage level Vss, the voltage of the first node N21 is pulled from Vdd−Vth$_{T21}$+ΔVp to low voltage level Vss, and the voltage of the output terminal OUT is discharged from high voltage level Vdd to low voltage level Vss. The reasons are as follows:

a. the first TFT T21 is turned on, because the second clock signal CL2 is at high voltage level Vdd;

b. the second TFT T22 is turned off, because the second clock signal CL2 is at high voltage level Vdd and the third supplementary TFT MC is turned on, whereby the voltage of the second note N22 is pulled to be at low voltage level Vss, and the first clock signal CL1 so as to turn off the fourth TFT T24;

c. the third TFT T23 is turned off, because the first note N21 is at low voltage level Vss;

d. the fourth TFT T24 is turned off, because the first clock signal CL1 is at low voltage level Vss;

e. the third supplementary TFT MC is turned on, because the second clock signal CL2 is at high voltage level Vdd;

f. the fifth TFT T25 is turned on;

g. the sixth TFT T26 is turned off, because the output terminal OUT is at low voltage level Vss;

h. the first supplementary TFT MA is turned off, because the second note N22 is at low voltage level Vss;

i. the second supplementary TFT MB is turned off, because the second clock signal CL2 is at high voltage level Vdd;

j. the voltage of the first node N21 is at low voltage level Vss, because the second clock signal CL2 is at high voltage level Vdd and the input terminal IN is at low voltage level Vss, whereby the voltage of the first node N21 is pulled to be at low voltage level Vss;

k. the second node N22 is at low voltage level Vss, because the second clock signal CL2 is at high voltage level Vdd and the third supplementary TFT MC is turned on, whereby the second node N22 is pulled to be at low voltage level Vss; and l. the voltage of the third node N23 is $Vdd-Vth_{T25}$ with high voltage level, because the fourth and sixth TFTs T24 and T26 are turned off.

4. When the second clock signal CL2 is at low voltage level Vss and the first clock signal CL1 is at high voltage level Vdd, the signal of the input terminal IN is continuously kept to be at low voltage level Vss, the voltage of the first node N21 is at low voltage level Vss, and the voltage of the output terminal OUT is kept to be at low voltage level Vss. The reasons are as follows:

a. the first TFT T21 is turned off, because the second clock signal CL2 is at low voltage level Vss;

b. the second TFT T12 is turned on, because the voltage of the second note N22 is at high voltage level Vdd;

c. the third TFT T23 is turned off, because the first note N21 is at low voltage level Vss;

d. the fourth TFT T24 is turned on, because the first clock signal CL1 is at high voltage level Vdd;

e. the third supplementary TFT MC is turned off, because the second clock signal CL2 is at low voltage level Vss;

f. the fifth TFT T25 is turned on;

g. the sixth TFT T26 is turned off, because the signal of the output terminal OUT is at low voltage level Vss;

h. the first supplementary TFT MA is turned on, because the second note N22 is at high voltage level Vdd;

i. the second supplementary TFT MB is turned off, because the second clock signal CL2 is at low voltage level Vss;

j. the voltage of the first node N21 is at low voltage level Vss, because the fourth TFT T24 is turned on, whereby the voltage of the second node N22 is pulled to be the same as the high voltage level of the third node N23, and then the second TFT T22 is turned on, such that the first node N21 is pulled to be at low voltage level Vss;

k. the second node N22 is at high voltage level, because the fourth TFT T24 is turned on, whereby the voltage of the second node N22 is pulled to be the same as the high voltage level of the third node N23; and 5. the voltage of the third node N23 is at high voltage level, because the fourth and fifth TFTs T24, T25 are turned on at the same time, simultaneously the voltages of the second and third nodes N22 and N23 are quickly balanced, then the voltage of the third node N23 is discharged from $Vdd-Vth_{T25}$ to the voltage level that depends on the size of the fourth and fifth TFTs T24 and T25, and finally the voltage of the third node N23 is charged to be $Vdd-Vth_{T25}$ after some time, because the fifth TFT T25 is operated at the saturated region.

Figure 11:
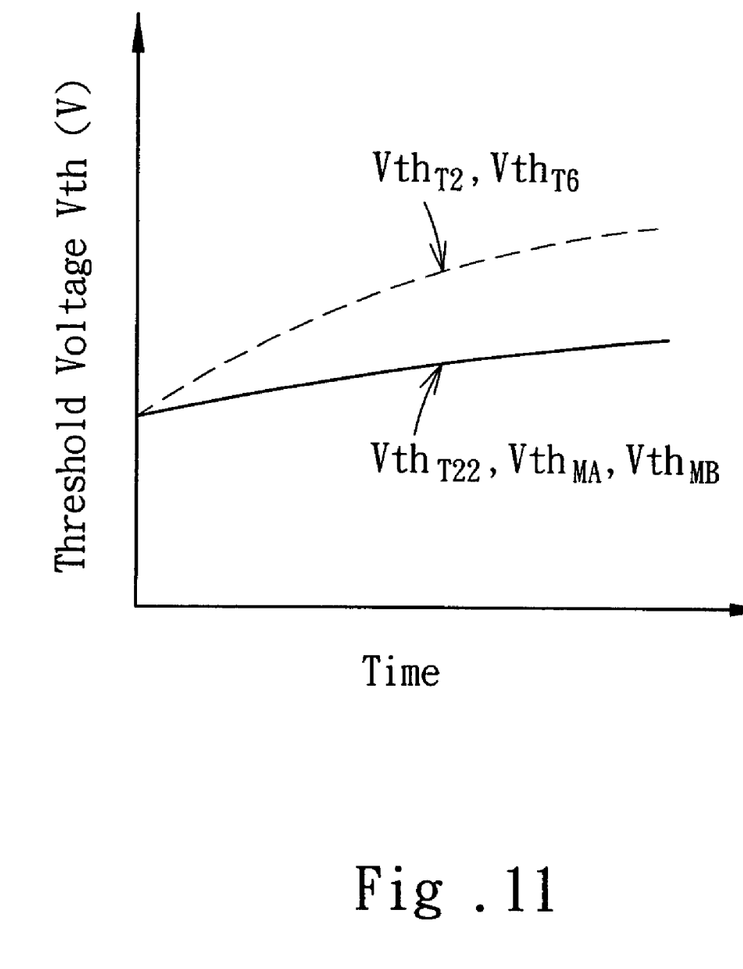
FIG. 11 shows the relationship between the threshold voltages and times of TFTs of the present invention and the prior art.

As described in the above-mentioned operational principle, after the output terminal OUT is at low voltage level, the first TFT T21 and the second TFT T22 are alternately turned on, whereby the first node N21 is at low voltage level Vss. The first supplementary TFT MA and the second supplementary TFT MB are alternately turned on, whereby the output terminal OUT is at low voltage level Vss. Thus, the above-mentioned manner improves the shift phenomena of the threshold voltages of the second TFT T22, the first supplementary TFT MA and the second supplementary TFT MB, decreases the increasing degree of the threshold voltages of the first supplementary TFT MA and the second supplementary TFT MB so the life time is extended. As shown in FIG. 11, it shows the relationship between the threshold voltage and times of TFTs of the present invention and the prior art. The second TFT T22, the first supplementary TFT MA and the second supplementary TFT MB are alternately driven in a half of duty cycle, and those are different from the TFTs T2 and T6 of U.S. Pat. No. 5,222,082, which is continuously stressed in the direct current condition. The design manner of the present invention can improve the shift phenomena of the threshold voltage of the second TFT T22, the first supplementary TFT MA and the second supplementary TFT MB, decreases the increasing degree of the threshold voltage of the second TFT T22, the first supplementary TFT MA and the second supplementary TFT MB because the life time is extended, and thereby increases the stability of the shift register circuit and the normal life time of the shift register circuit. Furthermore, according to the shift register circuit in the second embodiment, every node is not at the floating state and thereby can avoid the normal operation of circuit affected by noise signals.

The supplementary unit 20 according to the above-mentioned embodiments of the present invention improves the following disadvantages of the prior art. The first disadvantage of the prior art is that a plurality of TFTs of amorphous silicon are continuously stressed in the direct current condition, whereby the shift phenomena of the threshold voltages of the TFTs is unstable, and the shift degree of the threshold voltage affects the normal operation of the shift register circuit and further results in the abnormal operation of the shift register circuit. Furthermore, the second disadvantage of the prior art is that the node note P2 of the shift register circuit has two clock times at the floating state. The present invention improves the shift phenomena of the threshold voltage of the amorphous silicon TFTs, slows down the shift of the threshold voltage, and further increases the stability of scanning circuit and shift register circuit so as to increase the life time. Simultaneously, the nodes of the shift register circuit of the present invention are not at the floating state at any life time, and thereby can avoid the abnormal operation of circuit not affected by noise signals.

Although the invention has been explained in relation to its preferred embodiment, it is not used to restrain the invention. It is to be understood that many other possible modifications and variations can be made by those skilled in the art without departing from the spirit and scope of the invention as hereinafter claimed.

What is claimed is:

1. A shift register circuit with high stability, the shift register circuit comprising a plurality of stages, each of said stages cascaded to the succeeding stage in sequence and transmitting an output signal, an input signal inputted to an input terminal of the first stage, an input signal of each of other stages being an output signal of previous stage, and the shift register circuit provided with first and second clock signals in an inverse condition, each of stages comprising:
   a shift register circuit unit and a supplementary unit for electrically connecting to an output node of the shift register circuit unit,
   whereby the output signal of the output node is fed back to the shift register circuit unit and acts as a control signal, the control signal controls the shift register circuit unit;
   wherein the supplementary unit comprises:
   a first supplementary thin film transistor (TFT) with a gate electrode electrically connected to a first derivative node of the shift register circuit unit, a drain electrode electrically connected to the output node, and a source electrode electrically connected to a supply voltage with low voltage level;
   a second supplementary TFT with a gate electrode electrically connected to a second derivative node of the shift register circuit unit, a drain electrode electrically connected to the output node, and a source electrode electrically connected to a supply voltage with low voltage level; and
   a third supplementary TFT with a gate electrode electrically connected to the second derivative node of the shift register circuit unit, a drain electrode electrically connected to the first derivative node of the shift register circuit unit, and a source electrode electrically connected to a supply voltage with low voltage level.

2. The shift register circuit with high stability according to claim 1, wherein the first, second and third supplementary TFTs are amorphous silicon TFTs.

3. The shift register circuit with high stability according to claim 1, wherein the first, second and third supplementary TFTs are low temperature poly-silicon TFTs.

* * * * *